(12) United States Patent
Koumura et al.

(10) Patent No.: US 6,294,907 B1
(45) Date of Patent: Sep. 25, 2001

(54) CROSS-COIL TYPE INDICATING INSTRUMENT

(75) Inventors: Takashi Koumura, Toyota; Naoto Ogawa; Isao Miyagawa, both of Kariya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/247,864

(22) Filed: Feb. 11, 1999

(30) Foreign Application Priority Data

| Apr. 10, 1998 | (JP) | 10-099358 |
| May 11, 1998 | (JP) | 10-127683 |
| May 11, 1998 | (JP) | 10-127684 |

(51) Int. Cl.⁷ ............................... G01R 1/10; G01R 5/16
(52) U.S. Cl. ................................ 324/146; 324/144
(58) Field of Search ............................ 324/146, 144, 324/145, 147

(56) References Cited

U.S. PATENT DOCUMENTS

| 4,758,784 | * | 7/1988 | Baker et al. | 324/146 |
| 5,550,465 | | 8/1996 | Yamamoto et al. | 324/143 |
| 5,686,832 | * | 11/1997 | Ayres et al. | 324/146 |

FOREIGN PATENT DOCUMENTS

| 3-39169 | 4/1991 | (JP). |
| 3-40567 | 4/1991 | (JP). |
| 7-14902 | 4/1995 | (JP). |

\* cited by examiner

*Primary Examiner*—Christine Oda
*Assistant Examiner*—Henry S. Andersen
(74) *Attorney, Agent, or Firm*—Pillsbury Winthrop LLP

(57) ABSTRACT

A cross-coil type indicating instrument includes a bobbin having an upper center cylinder and a lower center cylinder, a cross-coil unit disposed around the bobbin, a shaft coaxially and rotatably supported by the upper and lower cylinder, a permanent magnet rotor, a dial, a pointer carried by said shaft, and a cup-shaped magnetic shield casing. The upper center cylinder has an upper bearing disposed to be generally flush with the upper surface of the cross coil unit, and the lower center cylinder has a lower bearing and extends through the magnetic shield casing so that the lower bearing is disposed at the back of the magnetic shield casing.

7 Claims, 3 Drawing Sheets

FIG. 2

|  | A | B | C | D | E | F |
|---|---|---|---|---|---|---|
| Lt (mm) | 0 | 0 | 2 | 4 | 6 | 8 |
| L (mm) | 14 | 7.86 | 9.86 | 11.86 | 13.86 | 15.86 |
| L−Lt (mm) | 14 | 7.86 | 7.86 | 7.86 | 7.86 | 7.86 |
| Ls (mm) | 11 | 6.7 | 8.7 | 10.7 | 12.7 | 14.7 |
| Lm (mm) | 4.3 | 2.7 | 4.7 | 6.7 | 8.7 | 10.7 |
| Lp (mm) | 14 | 12 | 12 | 12 | 12 | 12 |
| Wp (gf) | 3.5 | 3.5 | 3.5 | 3.5 | 3.5 | 3.5 |
| Ws (gf) | 0.2 | 0.2 | 0.2 | 0.2 | 0.2 | 0.2 |
| Wm (gf) | 2.17 | 2.17 | 2.17 | 2.17 | 2.17 | 2.17 |
| $\theta$ (°) | 20 | 20 | 20 | 20 | 20 | 20 |
| W1 (gf) | 7.35 | 9.17 | 8.43 | 7.94 | 7.59 | 7.33 |
| W2 (gf) | 1.84 | 3.65 | 2.91 | 2.42 | 2.07 | 1.81 |
| Wt (gf) | 9.19 | 12.83 | 11.34 | 10.36 | 9.66 | 9.14 |

CROSS-COIL TYPE INDICATING INSTRUMENT

CROSS REFERENCE TO RELATED APPLICATION

The present application is based on and claims priority from Japanese Patent Applications Hei 10-99358 filed on Apr. 10, 1998, Hei 10-127683 filed on May 11, 1998, and Hei 10-127684 filed on May 11, 1998, the contents of which are incorporated herein by reference.

BACKGROUND OF THE INVENTION

1. Field of the Invention

The present invention relates to a cross-coil type indicating instrument for use in a vehicle or a general industrial apparatus.

2. Description of the Related Art

As shown in JP-Y2-7-14902, a common cross-coil type indicating instrument has a hollow cylindrical bobbin and a cup-shaped shield casing. The bobbin is composed of upper and lower bobbin members, and the lower portion thereof is covered by the shield casing. Upper end of the upper bobbin member has a center cylinder extending from the upper surface of a cross-coil unit disposed around the bobbin, thereby forming a dead space. The bobbin rotatably supports a pointer shaft at upper and lower bearing portions thereof. The permanent magnet rotor and the pointer are fixed to be driven by the cross-coil unit when it is energized.

In order to make the indicating instrument more compact, it is necessary to reduce the dead space and friction force between the bearing portions and pointer. Friction force necessitates to increase the size of the cross-coil unit and permanent magnet rotor.

SUMMARY OF THE INVENTION

A main object of the invention is to provide a compact cross-coil type indicating instrument.

Another object of the invention is to provide an improved bobbin having bearings of a pointer shaft that reduces the friction between the bearings and the pointer shaft. The friction force is reduced by providing a maximum span of the bearings available to a cross-coil type indicating instrument.

In a cross-coil type indicating instrument according to a main aspect of the invention, an upper center cylinder extends from a bobbin to be flush with the upper surface of a cross coil unit, and a lower center cylinder extends through a magnetic shield casing to a portion in a dead space at the back of the magnetic shield casing.

In the cross-coil type indicating instrument as stated above, the shaft inclines to the horizon at an angle about 20°. Preferably, the lower bearing is located 2 to 8 mm back from the magnetic shield casing.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

FIG. 2 is a table showing dimensions, weights of portions related to the bearings and friction forces of the bearings of various indicating instruments;

DETAILED DESCRIPTION OF THE PREFERRED EMBODIMENTS

Figure 1:
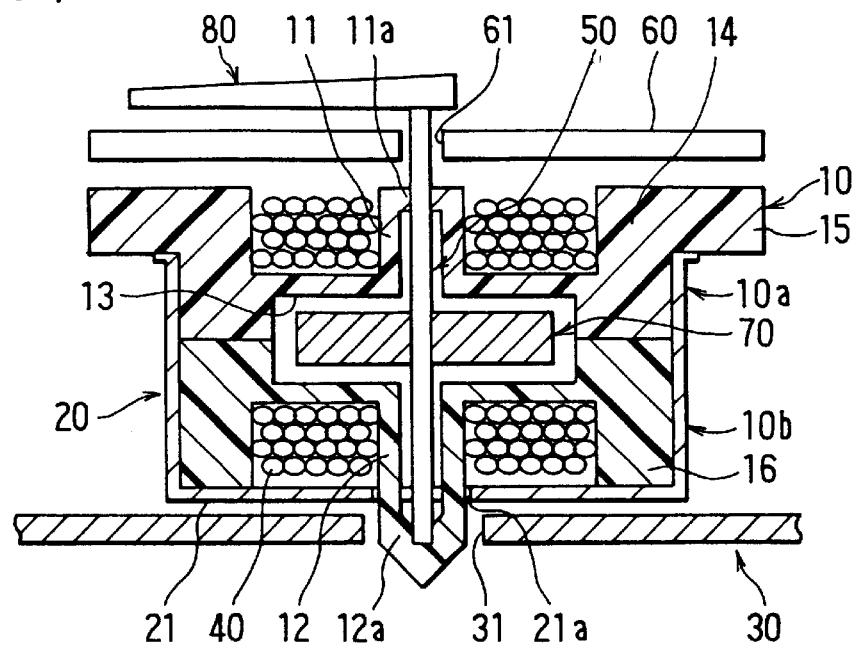
FIG. 1 is a cross-sectional side view illustrating a main portion of a cross-coil type indicating instrument according to a first embodiment of the invention.

An indicating instrument according to a first embodiment of the invention is described with reference to FIG. 1. The indicating instrument is usually mounted in the instrument panel of a vehicle with the longitudinal axis thereof being inclined to the horizon by an angle θ, such as 20°. The cross-coil type indicating instrument is composed of hollow cylindrical bobbin 10, cup-shaped magnetic shield casing 20, circuit board 30, cross-coil unit 40, steel pointer shaft 50, dial 60, ferrite permanent magnet rotor 70, and pointer 80.

Bobbin 10 is disposed in magnetic shield casing 20 and fixed to circuit board 30. Bobbin 10 is composed of upper bobbin member 10a and lower bobbin member 10b coupled together. Upper bobbin member 10a has upper center cylinder 11, upper winding frame 14 formed around center cylinder 11 and flange 15 extending from upper winding frame 14. Upper center cylinder 11 has upper bearing 11a at the upper end thereof. The upper end surface of upper center cylinder 11 is flush with the upper surfaces of upper winding frame 14, flange 15 and cross-coil unit 40. This reduces dead spaces between dial 60 and bobbin 10. Lower bobbin member 10b has lower center cylinder 12 and lower winding frame 16. Lower center cylinder 12 has lower bearing 12a at the lower end thereof. Lower center cylinder 12 extends downward through hole 21a of shield-casing-bottom 21 and through hole 31 of the circuit board so that lower center cylinder 12 and lower bearing 12a can be located in a dead space at the back surface of shield casing 20. Thus, the span between upper and lower bearings 11a, 12a can be increased without increase of the axial size of the indicating instrument.

Magnetic shield casing 20 is a cup-shaped member made of soft magnetic material such as permalloy or nickel-ferrite alloy to provide a magnetic circuit for permanent magnet rotor 50 and to block magnetic noises.

Cross-coil unit 40 is disposed at the outer periphery of bobbin 10 and is composed of a pair of coils crossing each other at right angles. Cross-coil unit 40 generates a composite magnetic field when energized by a drive circuit disposed in circuit board 30.

Pointer shaft 50 is rotatably supported by upper and lower bearings 11a, 12a and extends upward from shaft hole 61 of dial 60. Pointer shaft 50 is fixed at the middle to permanent magnet rotor 70 to be rotated thereby. Thus, pointer shaft 50 is supported by bearings 11a, 12a at a maximum span available to the indicator instrument, and friction forces F1 between pointer shaft 50 and upper bearing 11a, and friction force F2 between pointer shaft 50 and lower bearing 12a can be made small as described later.

Permanent magnet rotor 70 is disposed in chamber 13 inside bobbin 10 to be rotated under the composite magnetic field generated by cross-coil unit 40.

Pointer 80 is carried by pointer shaft 50 at the tip thereof to swing over the front surface of dial 60 to indicate engine rotation, vehicle speed or the like.

Figure 3:
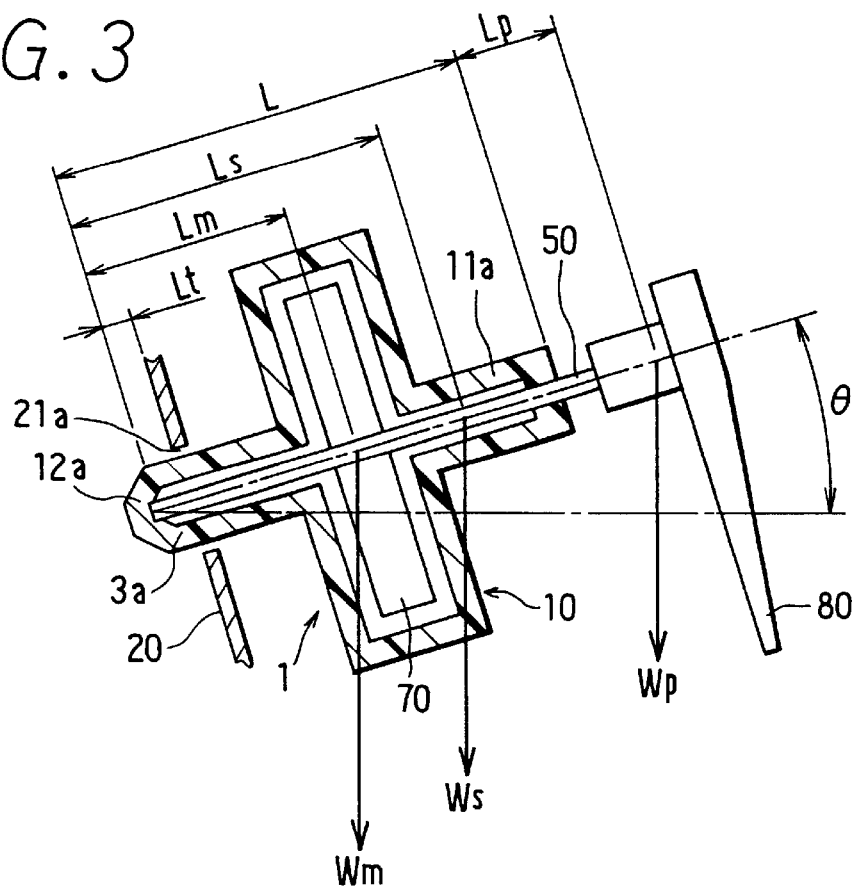
FIG. 3 is a diagram showing the dimensions and weights listed in the table in FIG. 2.

In FIG. 3, friction forces F1, F2 are expressed as follows:

$$F1 = W1 \cdot \mu \cdot s1,$$

where W1 is a weight of pointer shaft 50 applied to upper bearing, $\mu$ is a coefficient of the friction between pointer shaft 50 and one of the bearings, and s1 is a area of contacting surface of upper bearing 11a with pointer shaft 50; and $$F2 = W2 \cdot \mu \cdot s2,$$

where W2 is a weight of pointer shaft 50 applied to lower bearing, and s2 is a area of contacting surface of lower bearing 12a with pointer shaft 50.

Weights W1, W2 are expressed as follows:

$$W1 = [Wm \cdot Lm + Ws \cdot Ls + Wp \cdot (L+Lp)] \cos \theta / L$$

$$W2 = [Wm \cdot (L-Lm) + Ws \cdot (L-Ls) - Wp \cdot Lp] \cos \theta / L,$$

where L is a span between upper and lower bearings 11a, 12a, Ls is a distance between the center of gravity of pointer shaft 50 and lower bearing 12a, Lm is a distance from the center of gravity of permanent magnet rotor 70 and lower bearing 12a, Lp is a distance between the center of gravity of pointer 80 and upper bearing 11a, Wm is a weight of permanent magnet rotor 70, Ws is a weight of pointer shaft 50, and Wp is a weight of pointer 80.

Thus, weights W1, W2 are inversely proportional to the span between upper and lower bearings 11a, 12a. In other words, friction forces F1 and F2 are inversely proportional to the span between upper and lower bearings 11a, 12a.

Because the span between upper and lower bearings 11a, 12a is increased to a maximum available to the indicating instrument, friction between bearings 11a, 12a and pointer shaft 50 can be reduced as shown in FIG. 2.

In FIG. 2, the friction forces of various types of indicating instruments A–F are listed. Each of indicating instruments A–F has different sizes at various portions indicated in FIG. 3.

Lower bearing 12a of indicating instrument A does not extend from the back surface of the shield casing 20, that is Lt=0, and the axial size (L-Lt) of the indicating instrument is not small (14 mm). Although the axial size (L-Lt) of indicating instrument B is short (7.86 mm), total weight wt is large (12.83). On the other hand, the axial size (L-Lt) of indicating instruments C–F is small and total weight Wt is smaller than indicating instrument B, and indicating instrument F that has the longest span (15.86 mm) has the smallest total weight Wt (9.14 gf).

Figure 4:
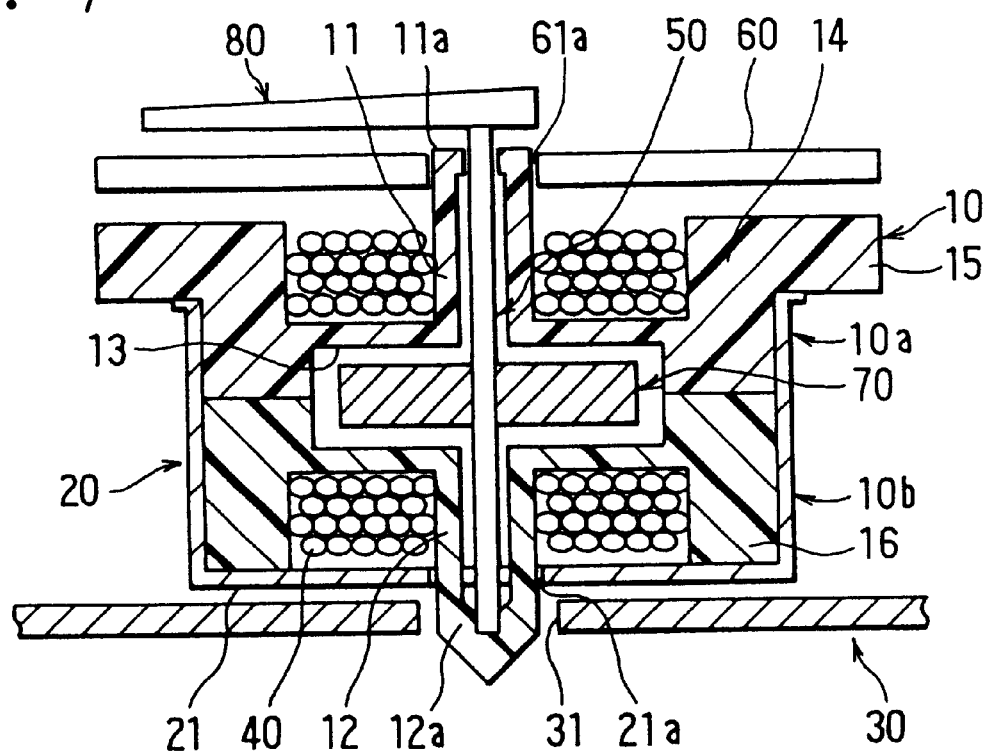
FIG. 4 is a cross-sectional side view illustrating a main portion of a cross-coil type indicating instrument according to a second embodiment of the invention.

An indicating instrument according to a second embodiment of the invention is described with reference to FIG. 4. Dial plate 60 has shaft hole 61a having an inside diameter slightly larger than the outside diameter of upper center cylinder 11, and upper center cylinder 11 extends from the upper surfaces of flange 15 so that the upper surface thereof becomes flush with the surface of dial plate 60. Thus, a sufficient length of the span between upper and lower bearings 11a, 12a can be ensured without increase in the dead space or size of bobbin 10.

Other portions and functions are the same as the first embodiment.

In the foregoing description of the present invention, the invention has been disclosed with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than restrictive, sense.

What is claimed is:

1. A cross-coil indicating instrument comprising:
   a dial having a shaft hole;
   a shaft having a shaft end extending through said shaft hole;
   a pointer carried by said shaft end;
   a cup-shaped magnetic shield casing;
   a bobbin unit having an upper bobbin, a lower bobbin and a central chamber and disposed inside said shield casing, said upper bobbin having an upper center cylinder supporting an upper portion of said shaft and an upper winding frame disposed around said upper center cylinder to provide an upper winding space, said lower bobbin having a lower center cylinder for supporting a lower portion of said shaft and a lower winding frame disposed around said lower center cylinder to provide a lower winding space;
   a cross-coil unit disposed in said upper and lower winding spaces so that the upper surface of said cross-coil unit is flush with the upper surface of said upper winding frame and the lower surface of said cross-coil unit is flush with the lower surface of said lower winding frame; and
   a permanent magnet rotor disposed in said central chamber of said bobbin unit and fixed to said shaft to drive the same, wherein
   said magnetic shield casing has a through hole at the bottom thereof, and said lower center cylinder and said lower portion of said shaft extend through said magnetic shield casing behind said magnetic shield casing.

2. The cross-coil indicating instrument as claimed in claim 1 further comprising a circuit board fixed to the back of said-shield casing.

3. The cross-coil indicating instrument as claimed in claim 2, wherein said shaft inclines to the horizon at an angle about 20°.

4. The cross-coil indicating instrument as claimed in claim 3, wherein
   said lower center cylinder extends to a portion located 2 to 8 mm back from said magnetic shield casing.

5. The cross-coil indicating instrument as claimed in claim 4, wherein
   a total length of said upper and lower center cylinder is between 9.8 mm and 16 mm.

6. The cross-coil indicating instrument as claimed in claim 1, wherein
   said shaft hole has a diameter larger than an outside diameter of said upper center cylinder, and
   said upper center cylinder extends beyond a flange to be flush with the surface of said dial.

7. The cross-coil indicating instrument as claimed in claim 1, wherein
   said upper center cylinder has an upper surface disposed to be flush with said upper surface of said cross-coil unit.

* * * * *